United States Patent
Saito et al.

(10) Patent No.: US 10,447,012 B2
(45) Date of Patent: Oct. 15, 2019

(54) SURFACE-EMITTING QUANTUM CASCADE LASER

(71) Applicant: KABUSHIKI KAISHA TOSHIBA, Minato-ku (JP)

(72) Inventors: Shinji Saito, Yokohama (JP); Tomohiro Takase, Sagamihara (JP); Rei Hashimoto, Edogawa (JP); Tsutomu Kakuno, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/189,148

(22) Filed: Nov. 13, 2018

(65) Prior Publication Data

US 2019/0148915 A1 May 16, 2019

(30) Foreign Application Priority Data

Nov. 16, 2017 (JP) ................. 2017-220739

(51) Int. Cl.
*H01S 5/00* (2006.01)
*H01S 5/34* (2006.01)
(Continued)

(52) U.S. Cl.
CPC ........ *H01S 5/3402* (2013.01); *H01S 5/02476* (2013.01); *H01S 5/0425* (2013.01);
(Continued)

(58) Field of Classification Search
CPC ...... H01S 5/3402; H01S 5/0425; H01S 5/105; H01S 5/18; H01S 5/02476; H01S 5/1203; H01S 5/18386; H01S 5/3401
See application file for complete search history.

(56) References Cited

U.S. PATENT DOCUMENTS

| 6,826,223 B1 * | 11/2004 | Meyer ............... H01S 5/18 372/102 |
| 10,084,282 B1 * | 9/2018 | Kaspi ............... H01S 5/0655 |

(Continued)

FOREIGN PATENT DOCUMENTS

| JP | 2003-23193 | 1/2003 |
| JP | 2006-156901 | 6/2006 |

(Continued)

OTHER PUBLICATIONS

Xu, G. et al. "Surface-emitting quantum cascade lasers with metallic photonic-crystal resonators," Applied Physics Letters 94, 221101, https://doi.org/10.1063/1.3143652, 2009, pp. 4.

*Primary Examiner* — Kinam Park
(74) *Attorney, Agent, or Firm* — Oblon, McClelland, Maier & Neustadt, L.L.P.

(57) ABSTRACT

A surface-emitting quantum cascade laser of an embodiment includes a semiconductor stacked body, an upper electrode, and a lower electrode. The semiconductor stacked body includes an active layer that includes a quantum well layer and emits infrared laser light, a first semiconductor layer that includes a photonic crystal layer in which pit parts constitute a rectangular grating, and a second semiconductor layer. The upper electrode is provided on the first semiconductor layer. The lower electrode is provided on a lower surface of a region of the second semiconductor layer overlapping at least the upper electrode. The photonic crystal layer is provided on the upper surface side of the first semiconductor layer. In plan view, the semiconductor stacked body includes a surface-emitting region including the photonic crystal layer and a current injection region. The upper electrode is provided on the current injection region.

8 Claims, 9 Drawing Sheets

(51) Int. Cl.
  *H01S 5/18*   (2006.01)
  *H01S 5/10*   (2006.01)
  *H01S 5/042*  (2006.01)
  *H01S 5/183*  (2006.01)
  *H01S 5/024*  (2006.01)
  *H01S 5/12*   (2006.01)

(52) U.S. Cl.
  CPC ............ *H01S 5/105* (2013.01); *H01S 5/1203* (2013.01); *H01S 5/18* (2013.01); *H01S 5/18386* (2013.01); *H01S 5/3401* (2013.01)

(56) References Cited

U.S. PATENT DOCUMENTS

| | | |
|---|---|---|
| 2004/0247009 A1 | 12/2004 | Noda et al. |
| 2009/0279579 A1 | 11/2009 | Ohnishi et al. |
| 2013/0307108 A1 | 11/2013 | Nakajima et al. |
| 2015/0053922 A1 | 2/2015 | Nakajima et al. |
| 2015/0097156 A1 | 4/2015 | Nakajima et al. |
| 2016/0020581 A1 | 1/2016 | Hirose et al. |
| 2017/0271849 A1* | 9/2017 | Saito ............ H01S 5/0425 |
| 2019/0074663 A1* | 3/2019 | Saito ............ H01S 5/105 |
| 2019/0081454 A1* | 3/2019 | Saito ............ H01S 5/12 |

FOREIGN PATENT DOCUMENTS

| | | |
|---|---|---|
| JP | 2009-231773 | 10/2009 |
| JP | 2009-295904 | 12/2009 |
| JP | 2010-98135 | 4/2010 |
| JP | 2010-278326 | 12/2010 |
| JP | 2011-108935 | 6/2011 |
| JP | 2013-77756 | 4/2013 |
| JP | 2014-197659 | 10/2014 |
| JP | 2017-168594 | 9/2017 |
| JP | 2017-188700 | 10/2017 |
| JP | 2018-93022 | 6/2018 |
| JP | 2019-47023 A | 3/2019 |
| WO | WO 2007/029538 A1 | 3/2007 |
| WO | WO 2013/172269 A1 | 11/2013 |
| WO | WO 2014/136653 A1 | 9/2014 |
| WO | WO 2016/031965 A1 | 3/2016 |

* cited by examiner

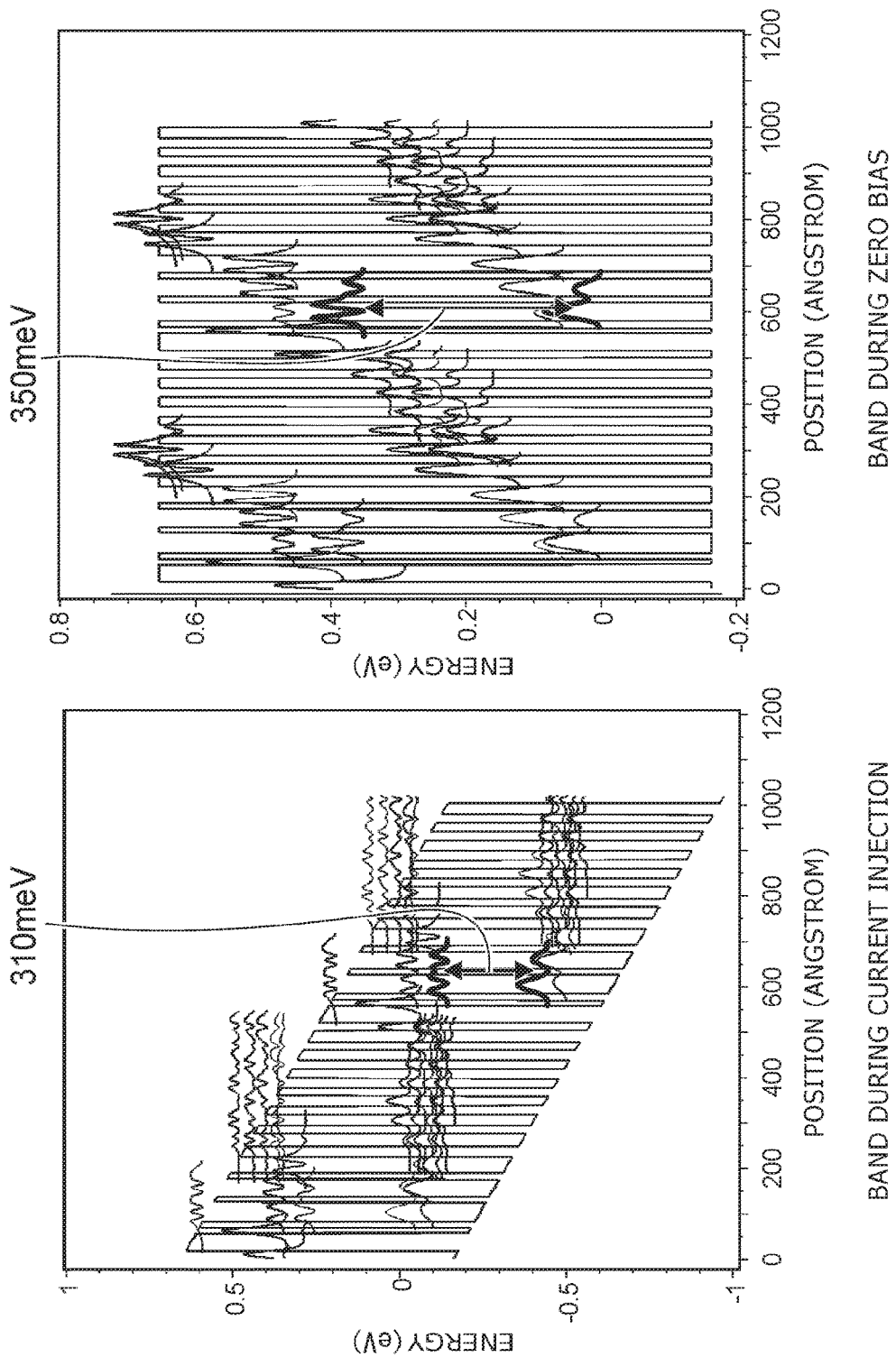

SURFACE-EMITTING QUANTUM CASCADE LASER

CROSS-REFERENCE TO RELATED APPLICATIONS

This application is based upon and claims the benefit of priority from Japanese Patent Application No. 2017-220739, filed on Nov. 16, 2017; the entire contents of which are incorporated herein by reference.

FIELD

Embodiments described herein relate generally to a surface-emitting quantum cascade laser.

BACKGROUND

The surface-emitting quantum cascade laser lases in the TM (transverse magnetic) mode and emits laser light with wavelengths from infrared to terahertz.

The optical resonator can be configured from a two-dimensional photonic crystal provided near the active layer.

The surface-emitting quantum cascade laser including a two-dimensional photonic crystal is operated as a laser of the surface emission type capable of emitting laser light in a direction generally perpendicular to the surface of the active layer.

In a structure including the current injection part and the photonic crystal part in the same region, increasing the operating current to obtain high output power results in raising the chip operating temperature. This increases the change of refractive index of the photonic crystal part and degrades optical characteristics.

BRIEF DESCRIPTION OF THE DRAWINGS

FIG. 8A is an energy band diagram during current injection of the quantum cascade laser, and FIG. 8B is an energy band diagram during zero bias;

DETAILED DESCRIPTION

In general, a surface-emitting quantum cascade laser of an embodiment includes a semiconductor stacked body, an upper electrode, and a lower electrode. The semiconductor stacked body includes an active layer that includes a quantum well layer causing intersubband transition and that emits infrared laser light, a first semiconductor layer that is provided on the active layer and that includes a photonic crystal layer in which pit parts constitute a rectangular grating, and a second semiconductor layer provided below the active layer. The upper electrode is provided on an upper surface of the first semiconductor layer. The lower electrode is provided on a lower surface of a region of the second semiconductor layer overlapping at least the upper electrode. The photonic crystal layer is provided on the upper surface side of the first semiconductor layer. The planar shape of an opening end of each of the pits is asymmetric with respect to lines passing through a barycenter of the planar shape and being respectively parallel to two sides of the rectangular grating. In plan view, the semiconductor stacked body includes a surface-emitting region including the photonic crystal layer and a current injection region extending radially outward from an outer edge of the surface-emitting region. The upper electrode is provided on the current injection region of the upper surface of the first semiconductor layer. The active layer generates a gain by the intersubband transition based on a current flowing between the upper electrode and the lower electrode in the current injection region to enable emission of the infrared laser light in a direction generally perpendicular to the surface-emitting region while causing optical resonance based on the rectangular grating in the surface-emitting region.

Embodiments of the invention will now be described with reference to the drawings.

Figure 1A:
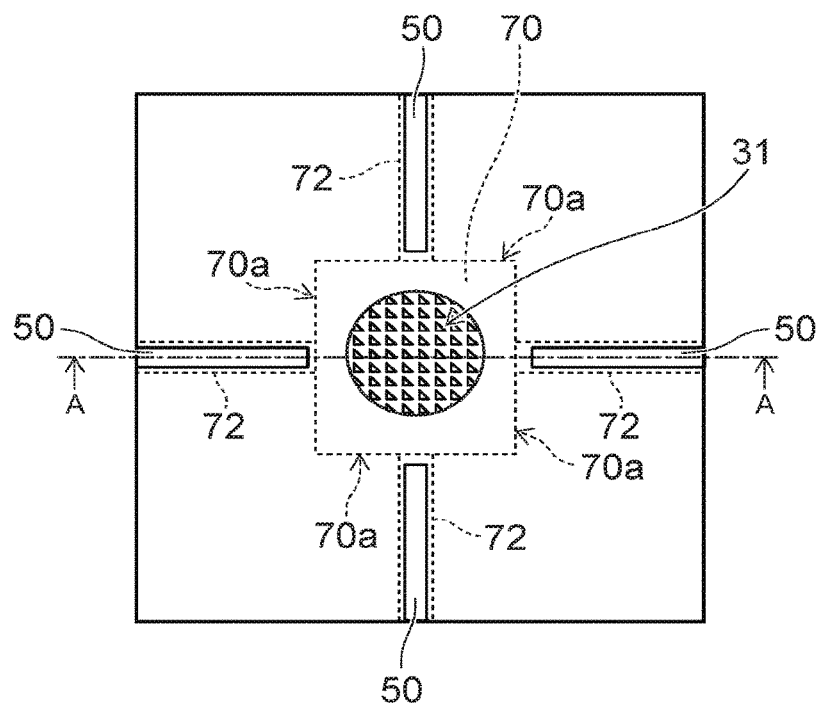
FIG. 1A is a schematic plan view of a surface-emitting quantum cascade laser according to a first embodiment.
Figure 1B:
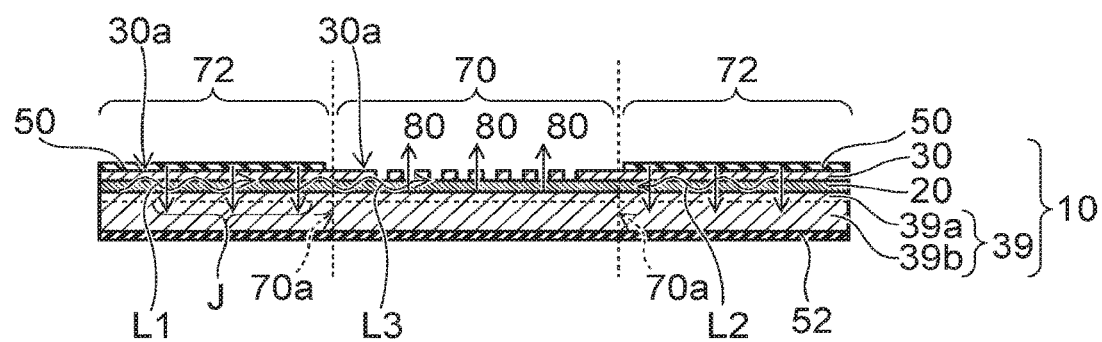
FIG. 1B is a schematic front view taken along line A-A.

FIG. 1A is a schematic plan view of a surface-emitting quantum cascade laser according to a first embodiment. FIG. 1B is a schematic front view taken along line A-A.

The surface-emitting quantum cascade laser of the first embodiment includes a semiconductor stacked body 10, an upper electrode 50, and a lower electrode 52.

The semiconductor stacked body 10 includes an active layer 20 that includes a quantum well layer causing intersubband transition and that emits infrared laser light, a first semiconductor layer 30 that is provided on the active layer and that includes a photonic crystal layer including a two-dimensional diffraction grating, and a second semiconductor layer 39 provided below the active layer 20.

The upper electrode 50 is provided on the upper surface of the first semiconductor layer 30. The lower electrode 52 is provided on the lower surface of a region of the second semiconductor layer 39 overlapping at least the upper electrode 50. The photonic crystal layer 31 is provided on the upper surface 30a side of the first semiconductor layer 30.

In plan view, the semiconductor stacked body 10 includes a surface-emitting region 70 including the photonic crystal layer 31 and a current injection region 72 extending radially outward from the outer edge 70a of the surface-emitting region 70. That is, as shown in FIG. 1B, the surface-emitting region 70 represents a region in which part of the first semiconductor layer 30 (including the photonic crystal layer 31), part of the active layer 20, and part of the second semiconductor layer 39 are stacked in the central part of the chip. The current injection region 72 represents a region in which another part of the first semiconductor layer 30, another part of the active layer 20, and another part of the second semiconductor layer 39 are stacked in the outer peripheral part of the chip.

The upper electrode 50 is provided on the current injection region 72 of the upper surface 30a of the first semiconductor layer 30. In FIG. 1A, the current injection region 72 is provided along two lines orthogonal to each other on the upper surface 30a of the first semiconductor layer 30.

The active layer 20 included in the current injection region 72 causes intersubband transition by current 3 flowing between the upper electrode 50 and the lower electrode 52. This enables emission of infrared laser light 80 in the direction perpendicular to the surface-emitting region 70 while causing optical resonance by the two-dimensional diffraction grating.

As shown in FIG. 1B, the current 3 flowing between the upper electrode 50 and the lower electrode 52 enables intersubband transition. Light L1, L2, L3 generated in the current injection region 72 travels toward the surface-emitting region 70. This enables emission of infrared laser light 80 in the direction perpendicular to the surface-emitting region 70 while causing optical resonance by the photonic crystal layer 31 of the surface-emitting region 70.

The upper electrode 50 may be provided on the upper surface of the first semiconductor layer 30 of the current injection region 72 so as to extend outward along two lines orthogonal to each other from the upper surface 30a of the first semiconductor layer 30.

The first semiconductor layer 30 may include a cladding layer on the active layer 20 side. The second semiconductor layer 39 may include a cladding layer 39a on the active layer 20 side and a substrate 39b on the lower electrode 52 side.

Figure 2:
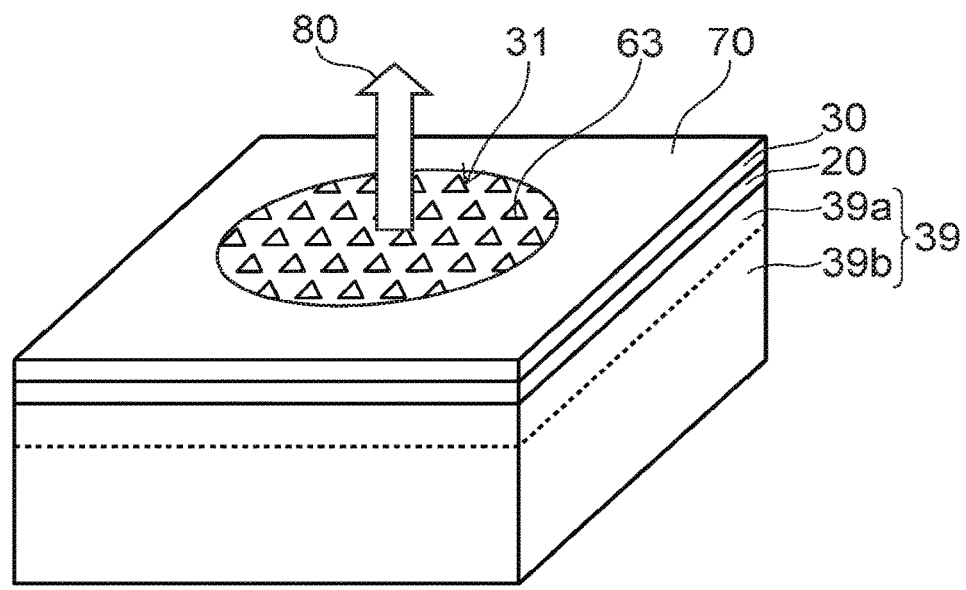
FIG. 2 is a schematic perspective view of the surface-emitting region of the surface-emitting quantum cascade laser according to the first embodiment.

FIG. 2 is a schematic perspective view of the surface-emitting region of the surface-emitting quantum cascade laser according to the first embodiment.

Figure 3:
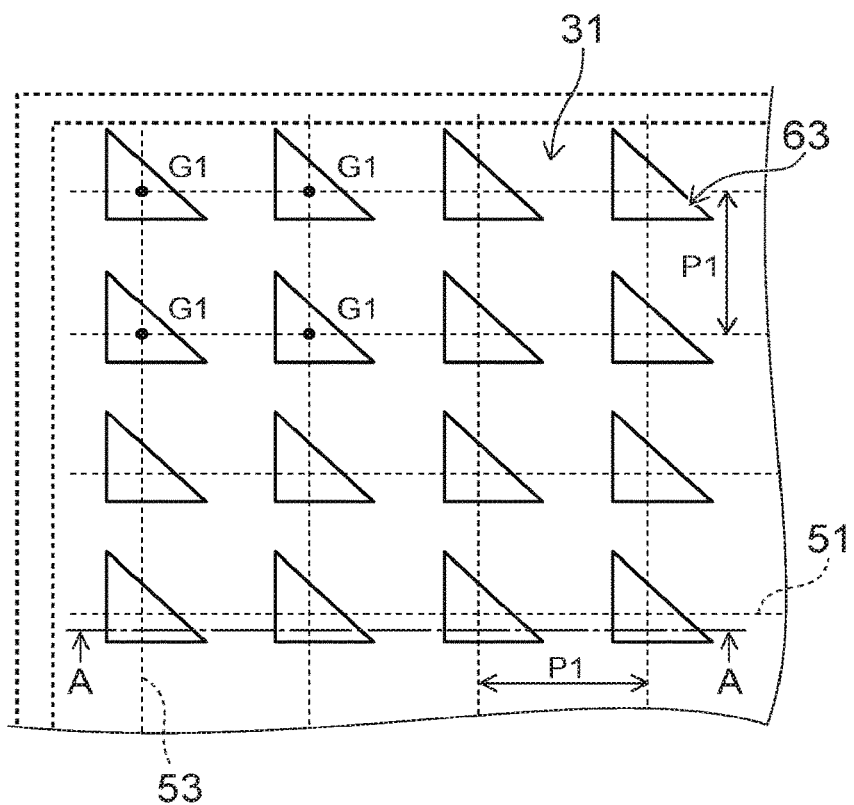
FIG. 3 is a schematic plan view of the two-dimensional grating region of the surface-emitting quantum cascade laser according to the first embodiment.

FIG. 3 is a schematic plan view of the two-dimensional grating region of the surface-emitting quantum cascade laser according to the first embodiment.

The planar shape of the pit 63 is asymmetric with respect to a line (51 or 53) passing through the barycenter G of the planar shape and being parallel to at least one side of the two-dimensional rectangular grating. The infrared laser light 80 is emitted in a direction generally perpendicular to the active layer 20. In this specification, the generally perpendicular direction refers to 81° or more and 99° or less with respect to the surface of the active layer 20. The current injection region is orthogonal to one of the two sides 51, 53 of the rectangular grating.

In FIGS. 2 and 3, the pit 63 is a right triangular prism (the planar shape being a right triangle). However, the planar shape of the pit 63 is not limited to a right triangle, but only needs to be asymmetric with respect to each of the two sides 51, 53 of the grating.

The first semiconductor layer 30 and the second semiconductor layer 39 may each include an n-type layer. Then, carriers causing intersubband transition are electrons. The thickness of the first semiconductor layer 30 can be several μm. The thickness of the second semiconductor layer 39 can be several μm.

Intersubband transition is caused by the passage of carriers through the quantum well layer under the electric field applied between the upper electrode 50 and the lower electrode 52. This emits single-mode laser light having a wavelength of e.g. 2-100 μm. The grating pitch P1 of the first pits 63 can be set to approximately the in-medium wavelength of the infrared laser light 80.

Figure 4:
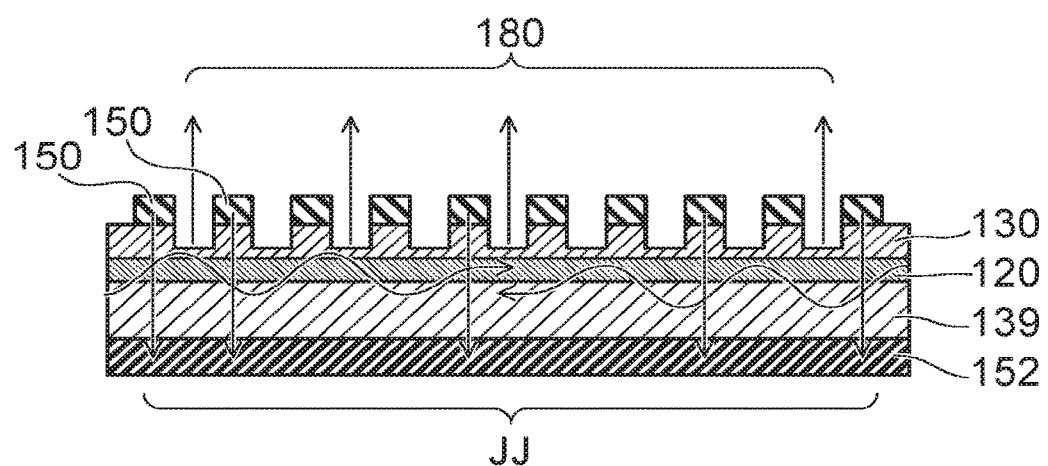
FIG. 4 shows a surface-emitting quantum cascade laser according to a comparative example.

FIG. 4 shows a surface-emitting quantum cascade laser according to a comparative example.

In the comparative example, the upper electrode 150 is provided on the upper surface of the photonic crystal layer of the first semiconductor layer 130. The surface-emitting region and the current injection region are located in the same region. Thus, the injection current JJ flows vertically in the photonic crystal layer. Light (horizontal arrow) is generated in the active layer 120 provided below the first semiconductor layer 130. The light is emitted upward while resonating in the two-dimensional grating. The comparative example has a simple structure and a small chip size. However, when the current is increased, the temperature inside the device rises, and the refractive index changes. This degrades optical characteristics and makes it difficult to increase the output power.

In contrast, in the first embodiment, the current injection region 72 and the surface-emitting region 70 are spaced from each other. Thus, most of the heat generated in the current injection region 72 is ejected outside through the lower electrode 52 and a heat sink provided below. Accordingly, the heat is less likely to be conducted to the surface-emitting region 70 provided inside the current injection region 72. As a result, the degradation of optical characteristics caused by the change of refractive index of the surface-emitting region 70 due to temperature increase is suppressed. This facilitates increasing the output power.

Figure 5A:
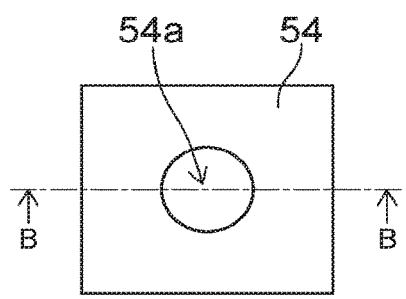
FIG. 5A is a schematic plan view of a surface-emitting quantum cascade laser according to a second embodiment and FIG. 5B is a schematic sectional view taken along line B-B.
Figure 5B:
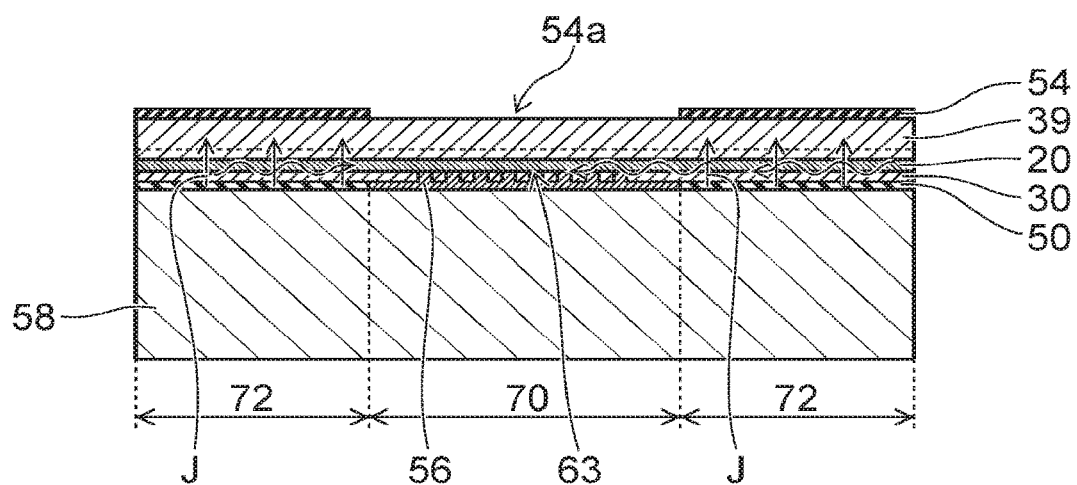

FIG. 5A is a schematic plan view of a surface-emitting quantum cascade laser according to a second embodiment. FIG. 5B is a schematic sectional view taken along line B-B.

In the second embodiment, a metal layer 56 is provided so as to cover the photonic crystal layer 31 including the inner surface and the bottom surface of the pit 63 provided in the upper surface of the first semiconductor layer 30. In this case, surface emission is possible in the surface-emitting region 70 provided with a periodic structure of the pits 63. The lower electrode 54 is provided with an opening 54a enabling infrared laser light reflected by the metal layer 56 to be emitted outward. The upper surface of the metal layer 56 and the upper surface of the upper electrode 50 can serve as a heat sink attachment surface.

The surface-emitting region 70 is not subjected to current injection. However, the metal layer 56 having good thermal conductivity is provided inside the pit 63. The metal layer 56 is in contact with the first semiconductor layer 30. The metal layer 56 and the upper electrode 50 can be brought into contact with the heat sink 58. Thus, the heat generated in the current injection region 72 and the heat slightly generated in the surface-emitting region 70 can be efficiently ejected outside. This improves temperature characteristics and facilitates increasing the output power.

Figure 6A:
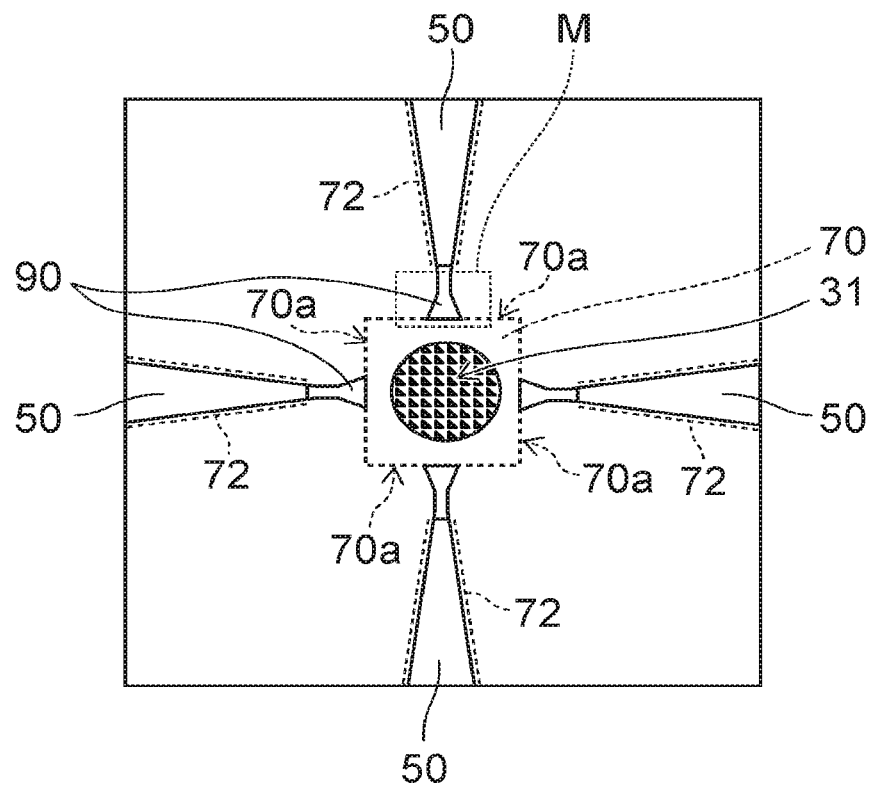
FIG. 6A is a schematic plan view of a surface-emitting quantum cascade laser according to a third embodiment.
Figure 6B:
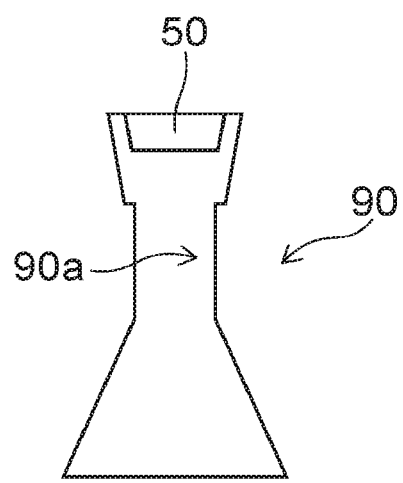
FIG. 6B is a schematic plan view enlarging the part M.

FIG. 6A is a schematic plan view of a surface-emitting quantum cascade laser according to a third embodiment. FIG. 6B is a schematic plan view enlarging the part M.

The third embodiment is a surface-emitting quantum cascade laser in which an optical functional element is incorporated in the non-excitation region. The optical functional element can be e.g. a tapered resonator 90. The tapered resonator 90 is not provided with the upper electrode 50. Thus, the region of the active layer of the tapered resonator 90 is free from excitation. The region 90a of the minimum taper width of the tapered resonator 90 is connected to the surface-emitting region 70. The tapered resonator 90 expands laser light while maintaining the single mode in the photonic crystal layer 31 and returns the return light from the photonic crystal layer 31 to the resonator.

Figure 7A:
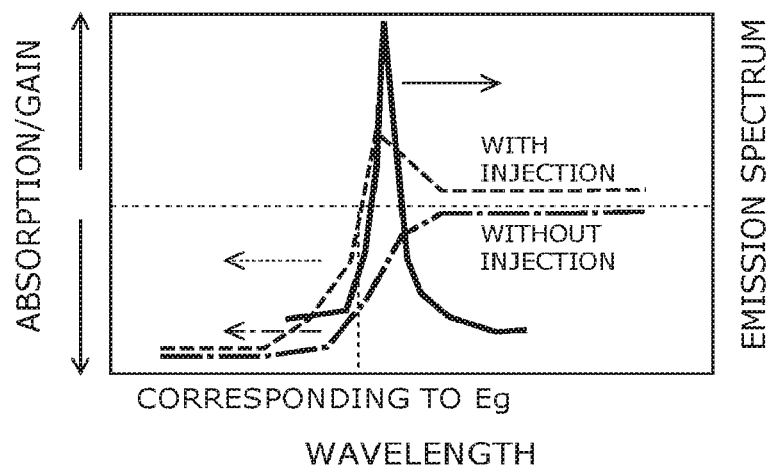
FIG. 7A is a graph of the dependence of gain/absorption or emission spectrum on wavelength in the p-n junction laser diode.
Figure 7B:
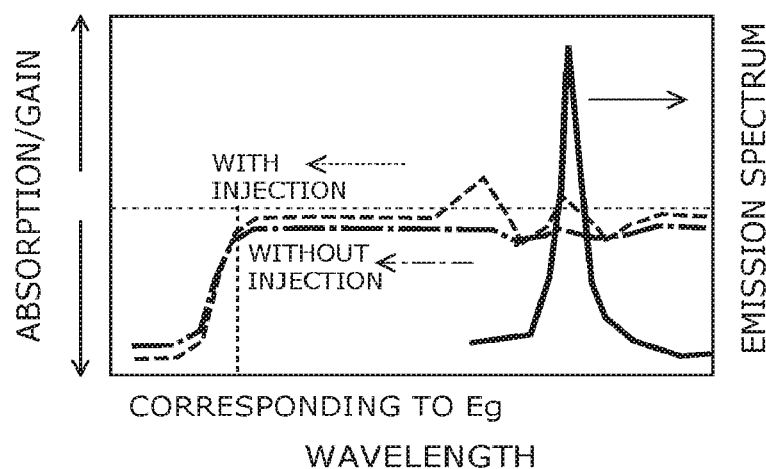
FIG. 7B is a graph of the dependence of gain/absorption or emission spectrum on wavelength in the quantum cascade laser.

FIG. 7A is a graph of the dependence of gain/absorption or emission spectrum on wavelength in the p-n junction laser diode. FIG. 7B is a graph of the dependence of gain/absorption or emission spectrum on wavelength in the quantum cascade laser.

FIG. 8A is an energy band diagram during current injection of the quantum cascade laser. FIG. 8B is an energy band diagram during zero bias.

As shown in FIG. 7A, the p-n junction laser diode lases at a wavelength corresponding to the bandgap energy Eg by recombination of holes and electrons. That is, when there is no injection of carriers (dot-dashed line), optical absorption is high near the lasing wavelength (corresponding to Eg). Thus, optical loss in the tapered resonator increases unless the gain is increased by injecting a current as shown by the dashed line.

In contrast, as shown in FIGS. 7B, 8A, and 8B, the surface-emitting quantum cascade laser of the third embodiment emits light by intersubband transition of electrons. In intersubband transition, the lasing wavelength does not depend on the bandgap energy. Thus, at the emission wavelength, optical absorption is low even when there is no injection of carriers (shown by the dot-dashed line). Accordingly, an optical functional element such as a two-dimensional diffraction grating and DBR (distributed Bragg reflector) can be provided even in the non-excitation state.

Figure 9A:
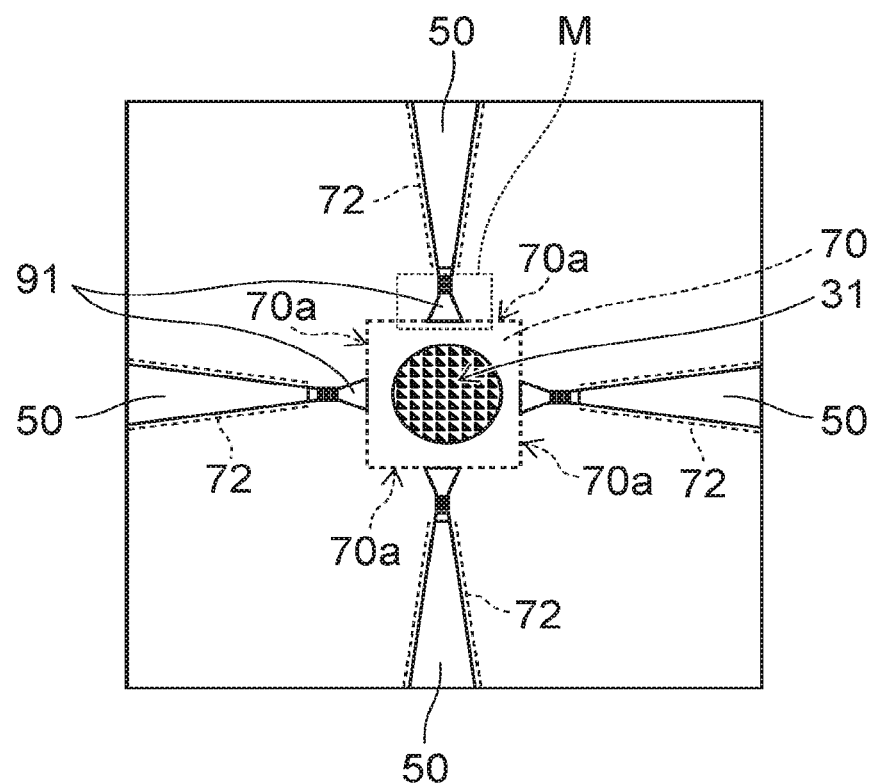
FIG. 9A is a schematic plan view of a surface-emitting quantum cascade laser according to a variation of the third embodiment and FIG. 9B is a schematic plan view enlarging the part M.
Figure 9B:
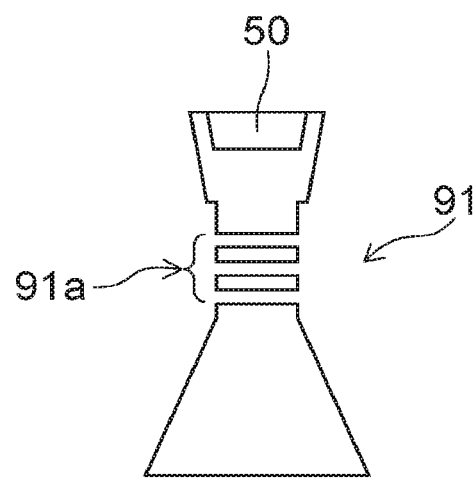

FIG. 9A is a schematic plan view of a surface-emitting quantum cascade laser according to a variation of the third embodiment. FIG. 9B is a schematic plan view enlarging the part M.

The variation of the third embodiment is a surface-emitting quantum cascade laser in which an optical functional element is incorporated in the non-excitation region. The optical functional element is a tapered resonator 91. The tapered resonator 91 is provided with a DBR (distributed Bragg reflector) generating resonance in the taper.

In FIGS. 9A and 9B, the tapered resonator 91 is not provided with the upper electrode 50. However, the tapered region may be provided with the upper electrode 50. The region 91a of the minimum taper width of the tapered resonator 91 is connected to the surface-emitting region 70. The tapered resonator 91 expands laser light while maintaining the single mode in the photonic crystal layer 31 and returns the return light from the photonic crystal layer 31 to the tapered resonator 91.

Figure 10A:
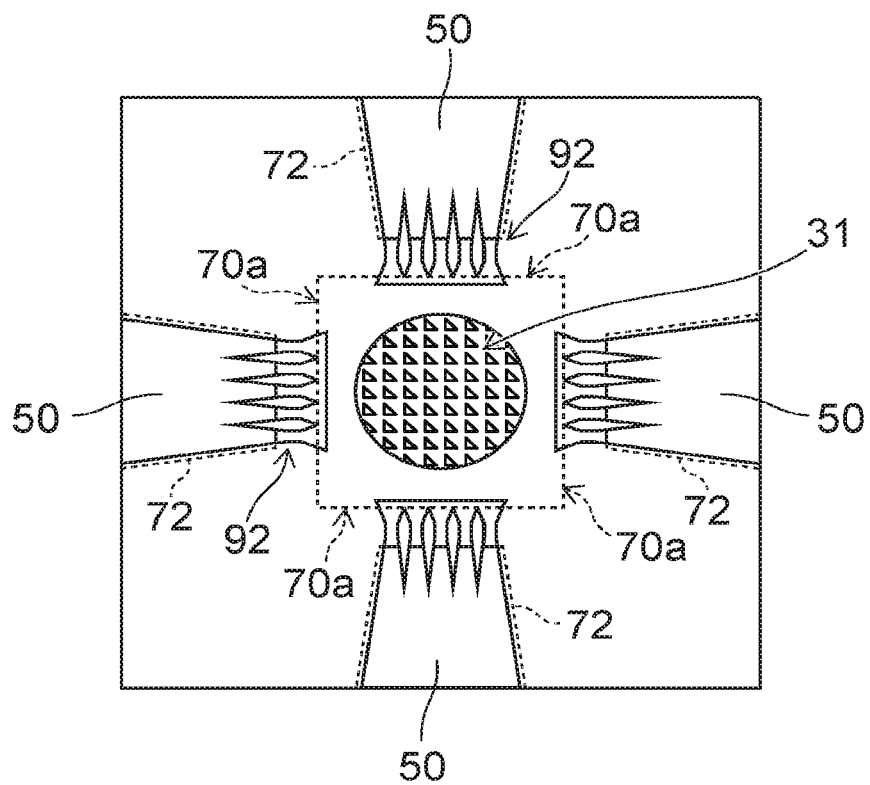
FIG. 10A is a schematic plan view of a surface-emitting quantum cascade laser according to a fourth embodiment.
Figure 10B:
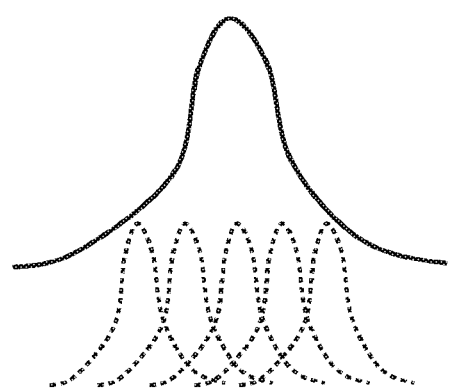
FIG. 10B is a graph of the far-field image of the combined light emission.

FIG. 10A is a schematic plan view of a surface-emitting quantum cascade laser according to a fourth embodiment. FIG. 10B is a graph of the far-field image of the combined light emission.

In the fourth embodiment, as shown in FIG. 10A, tapered resonators 92 are provided like a parallel array to constitute an optical functional element. In this figure, one upper electrode 50 is partitioned into five tapered resonators.

The respective far-field images (dashed lines) near the five tapered resonators overlap each other in the photonic crystal layer 31 to produce an optical distribution with intensity as shown by the solid line. This realizes an intensity distribution with the light intensity having a single peak in the photonic crystal layer 31. The intensity of outgoing light extracted in the vertical direction by diffraction in the photonic crystal layer 31 has a distribution similarly having a single peak.

According to the third embodiment and the variation associated therewith and the fourth embodiment, the quantum well structure of the quantum cascade laser exhibits low optical absorption even in the non-excitation state. Thus, an optical functional element can be provided between the surface-emitting region 70 and the current injection region 72. This facilitates controlling optical characteristics by the optical functional element.

The optical absorption can be further reduced and made closer to transparency by implantation of various ions into the quantum well structure for disordering, or by introducing an oxide layer. The disordering by ion implantation is performed as follows. For instance, the region of the photonic crystal layer 31 is implanted with hydrogen and annealed for 30 minutes by setting the substrate temperature to 600° C. Then, atoms existing at the interface of the quantum well are subjected to interdiffusion. Thus, crystal mixing and disordering occur at the interface of the quantum well. Accordingly, Al diffuses into the well portion of the quantum well compared with the state before annealing. This entirely raises the energy of quantum levels of the well. Alternatively, implantation of relatively heavy atoms such as B disorders the entire quantum well. Then, the quantum well itself disappears, and the subbands vanish. This completely eliminates the optical absorption of intersubband transition of the photonic crystal layer 31.

An alternative method is to perform steam oxidation on Al of the InAlAs layer constituting the barrier layer of the quantum well of the active layer. The photonic crystal layer 31 is processed by dry etching. Before forming an insulating film, the wafer is introduced into a steam oxidation furnace. Upon steam oxidation, in the processed region of the photonic crystal layer 31, the side surface of the hole part of the photonic crystal is exposed to steam and oxidized. For instance, the wafer is introduced into the steam oxidation furnace at 450° C. and oxidized for 6 hours. Thus, the InAlAs barrier layer is oxidized 1.8 μm from the side surface. The spacing of the holes is not separated by 3.6 μm even in the wide portion. Thus, the InAlAs layer of the quantum well is entirely oxidized in the holed region. Accordingly, this region has a stacked structure of InAlO and InGaAs. Thus, the energy gap of the barrier layer is significantly increased. Accordingly, absorption by subbands in the quantum well is eliminated in this wavelength region.

The first and second embodiments provide a surface-emitting quantum cascade laser having improved high-temperature characteristics. The third and fourth embodiments provide a surface-emitting quantum cascade laser having improved high-temperature characteristics and being capable of controlling optical characteristics by including an optical functional element with low optical absorption. These surface-emitting quantum cascade lasers can be used in e.g. gas analysis devices, environment measurement devices, and laser processing machines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A surface-emitting quantum cascade laser comprising:
   a semiconductor stacked body including an active layer that includes a quantum well layer causing intersubband transition and that emits infrared laser light, a first semiconductor layer that is provided on the active layer and that includes a photonic crystal layer in which pits constitute a rectangular grating, and a second semiconductor layer provided below the active layer;

an upper electrode provided on an upper surface of the first semiconductor layer; and a lower electrode provided on a lower surface of a region of the second semiconductor layer overlapping at least the upper electrode, the photonic crystal layer being provided on the upper surface side of the first semiconductor layer, a planar shape of an opening end of each of the pits being asymmetric with respect to lines passing through a barycenter of the planar shape and being respectively parallel to two sides of the rectangular grating, in plan view, the semiconductor stacked body including a surface-emitting region including the photonic crystal layer and a current injection region extending radially outward from an outer edge of the surface-emitting region, the upper electrode being provided on the current injection region of the upper surface of the first semiconductor layer, and the active layer generating a gain by the intersubband transition based on a current flowing between the upper electrode and the lower electrode in the current injection region to enable emission of the infrared laser light in a direction generally perpendicular to the surface-emitting region while causing optical resonance based on the rectangular grating in the surface-emitting region.

2. The laser according to claim 1, wherein the current injection region is provided along two lines orthogonal to each other on the upper surface of the first semiconductor layer.

3. The laser according to claim 2, wherein the current injection region is orthogonal to at least one of the two sides of the rectangular grating.

4. The laser according to claim 1, further comprising:
a metal layer covering the surface-emitting region including the pits of the photonic crystal layer,
the lower electrode being provided with an opening enabling the infrared laser light reflected by the metal layer to be emitted outward, and
an upper surface of the metal layer and an upper surface of the upper electrode serve as a heat sink attachment surface.

5. The laser according to claim 1, wherein part of the quantum well layer of the active layer of the surface-emitting region is disordered.

6. The laser according to claim 1, wherein part of the quantum well layer of the active layer of the surface-emitting region is oxidized.

7. The laser according to claim 1, further comprising:
a tapered resonator between the current injection region and the surface-emitting region,
the infrared laser light being single-mode, and
a region of minimum taper width of the tapered resonator being connected to the surface-emitting region.

8. The laser according to claim 7, wherein the tapered resonators are provided like a parallel array.

* * * * *